(12) United States Patent
Ferrant

(10) Patent No.: US 6,489,810 B2
(45) Date of Patent: Dec. 3, 2002

(54) HIGHLY RELIABLE PROGRAMMABLE MONOSTABLE

(75) Inventor: Richard Ferrant, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/891,964

(22) Filed: Jun. 26, 2001

(65) Prior Publication Data

US 2001/0054913 A1 Dec. 27, 2001

(30) Foreign Application Priority Data

Jun. 27, 2000 (FR) .............................................. 0008215

(51) Int. Cl.[7] .......................................... H03K 19/007
(52) U.S. Cl. ............................ 326/104; 326/8; 326/9; 327/215; 327/219; 365/200; 365/225.7
(58) Field of Search ...................... 326/8–10; 365/225.7, 365/200; 327/215, 219, 225, 525

(56) References Cited

U.S. PATENT DOCUMENTS

| | | |
|---|---|---|
| 5,384,746 A | 1/1995 | Giolma |
| 5,570,313 A | 10/1996 | Masson et al. |
| 5,933,382 A * | 8/1999 | Yi et al. .................. 365/225.7 |
| 6,037,831 A * | 3/2000 | Watrobski et al. .......... 327/525 |
| 6,125,069 A * | 6/2000 | Aoki ....................... 365/225.7 |

FOREIGN PATENT DOCUMENTS

EP 0419760 A2 4/1991

OTHER PUBLICATIONS

European Patent Office Abstract of Japanese Publication No. 11120791 dated Apr. 30, 1999.
European Preliminary Search Report dated Mar. 8, 2001 for French Application No. 0008215.

* cited by examiner

*Primary Examiner*—Michael Tokar
*Assistant Examiner*—Vibol Tan
(74) *Attorney, Agent, or Firm*—Lisa K. Jorgenson; Jose Gutman; Fleit, Kain, Gibbons, Gutman & Bongini P.L.

(57) ABSTRACT

An electronic circuit with digital output including an auto-stable assembly of latches (1), a control assembly (2), a blowable assembly (3), a logic gate (4) including a first input connected to a common point (14) between the auto-stable assembly (1) and the blowable assembly (3), and a second input connected to the control input (20) of the electronic circuit. A breaker (5) is controlled by the output of the logic gate (4) and arranged between the auto-stable assembly (1) and ground, and an associated process.

28 Claims, 4 Drawing Sheets

HIGHLY RELIABLE PROGRAMMABLE MONOSTABLE

CROSS-REFERENCE TO RELATED APPLICATIONS

This application is based upon and claims priority from prior French Patent Application No. 0008215, filed on Jun. 27, 2000, the entire disclosure of which is herein incorporated by reference.

BACKGROUND OF THE INVENTION

1. Field of the Invention

The present invention generally relates to the field of monostable circuits, and in particular to monostable circuits used for managing redundancies in memories.

2. Description of the Prior Art

Memories are generally constructed as a matrix of rows and columns of memory cells. For a memory of given size, a certain number of additional rows and a certain number of additional columns are provided, intended to replace rows or columns whose post-fabrication operational tests proved to be negative.

This operation of replacing one or more rows and one or more columns requires the reconfiguring of the memory or more generally of the circuit to be repaired. However, this reconfiguring must not degrade the performance of the circuit either in terms of consumption or in terms of speed. Therefore, use is made of fuses that can be placed in open circuit by the firing of a laser beam. A circuit making it possible to recognize the state thereof, open or closed, and to provide digital information relating to this state must be arranged in proximity to the fuse. It goes without saying that this circuit must also be of small size and have low power consumption.

The testing of a memory generally consists in addressing all the cells in write mode according to a predetermined template, then in read mode so as to establish a map (bitmap) of the memory. The map obtained is compared with the template and any anomalies are thus detected. The blowing (the placing in open circuit) of the fuses is then organized so as to modify the interpretation of the addressing of the defective columns.

The means of blowing the fuses depend on the nature of the fuses used. In the case of laser-blowable fuses, all the fuses associated with the replacement of defective columns of all the circuits made on one and the same integrated circuit board are blown in succession by means of a laser.

Accordingly, there exists a need for overcoming the disadvantages of the prior art as discussed above.

SUMMARY OF THE INVENTION

The present invention proposes a circuit that achieves a reliable interface between the fuse and a digital output.

The present invention further proposes a circuit that is hardly sensitive to disturbances, in particular those due to alpha rays or to heavy ions.

A blowable circuit with digital output, according to one aspect of the invention, comprises an auto-stable assembly of latches, a control assembly, a blowable assembly, a logic gate comprising a first input coupled to a common point between the auto-stable assembly and the blowable assembly, and a second input coupled to the control input of the circuit, and a breaker controlled by the output of the logic gate and arranged between the auto-stable assembly and ground. The auto-stable assembly allows the information to be preserved despite harsh environmental conditions, due for example to incident alpha rays or heavy ions.

In one embodiment of the invention, the blowable assembly comprises a blowable element and a breaker which are arranged in series between the auto-stable assembly and a ground.

In one embodiment of the invention, the blowable element is coupled to the auto-stable assembly.

In another embodiment of the invention, the breaker of the blowable assembly is coupled to the auto-stable assembly.

Advantageously, the logic gate is of NAND type.

In one embodiment of the invention, the control assembly comprises two control breakers. The control input of the circuit can be coupled to the control terminal of the said two control breakers. Two inverters can be arranged between the input of the circuit and the control terminal of one of the said control breakers.

In one embodiment of the invention, the auto-stable assembly comprises at least four breakers, preferably eight breakers.

The present invention also relates to a process for reading a blowable element, in which:

before blowing, a control input coupled to a first input of a logic gate being at a first logic value, breakers are off, imposing in the second input of the said logic gate a logic value such that the output is at a complementary logic value, before blowing, the said control input being at the logic value complementary to the first logic value does not modify the output, the logic value of the second input of the logic gate being maintained, after blowing, the control input coupled to the first input of the said logic gate being at a first logic value, the breakers coupled to the input of the circuit are off, imposing on the second input of the said logic gate a logic value such that the output is maintained in the said complementary logic value and that, after the said control input has received a complementary logic value, the output goes permanently to the said first logic value.

By virtue of the invention, one obtains a circuit that is compact, that is to say occupies a small area of silicon, robust, and of low consumption irrespective of the state, open or closed, of the blowable element.

BRIEF DESCRIPTION OF THE DRAWINGS

The present invention will be better understood on reading the detailed description of an embodiment taken by way of non-limiting example and illustrated by the appended drawings.

DESCRIPTION OF THE PREFERRED EMBODIMENTS

Figure 1:
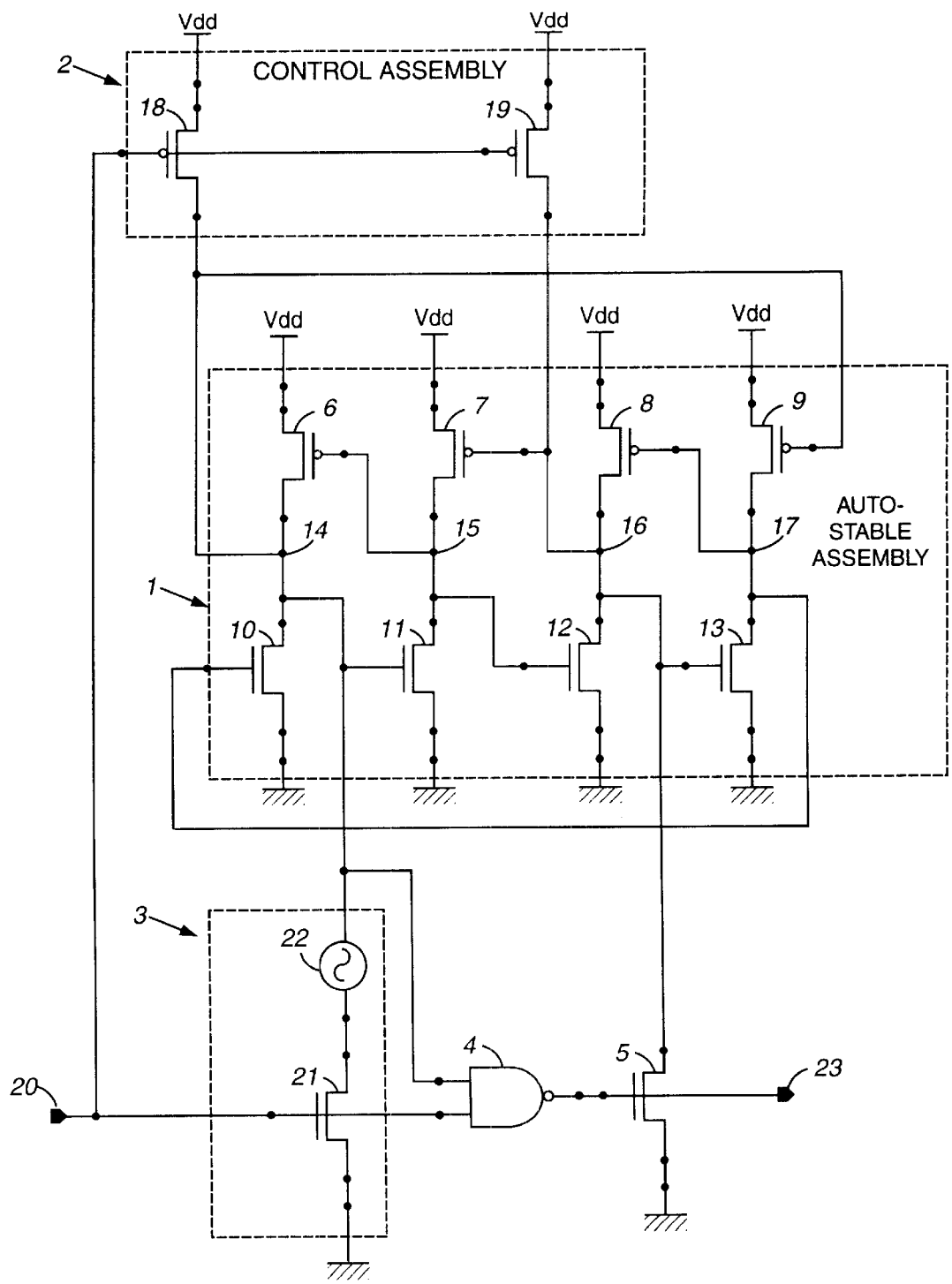
FIG. 1 is a diagram of an embodiment of the circuit according to the invention.

As may be seen in FIG. 1, the integrated circuit comprises an auto-stable assembly 1, a control assembly 2 for controlling the auto-stable assembly 1, a blowable assembly 3 coupled to the auto-stable assembly 1, a logic gate 4 and a breaker 5 which is coupled to the output of the logic gate 4 and to the auto-stable assembly 1.

The auto-stable assembly 1 is provided with eight breakers referenced 6 to 13, here in MOS technology, four PMOS transistors 6 to 9 and four NMOS transistors 10 to 13. The sources of the PMOS transistors 6 to 9 are coupled to the supply voltage Vdd, for example equal to 1.8 volts, and the sources of the NMOS transistors 10 to 13 are coupled to the ground of the circuit. The drains of the PMOS transistors 6 to 9 are coupled respectively to the drains of the NMOS transistors 10 to 13.

The gates of the PMOS transistors 6, 7, 8 and 9 are coupled respectively to the drains of the PMOS transistors 7, 8, 9 and 6. Likewise, the drains of the NMOS transistors 10, 11, 12 and 13 are coupled respectively to the gates of the NMOS transistors 11, 12, 13 and 10.

The auto-stable assembly 1 behaves like a memory cell in which the information is stored in four nodes bearing the references 14, 15, 16 and 17 which are respectively the drains of the PMOS transistors 6, 7, 8 and 9 and the drains of the NMOS transistors 10, 11, 12 and 13. The node 14 contains the information in the form of a logic level X. It therefore follows that X=1 or X=0. The next node 15 contains the information in the form of a logic level C(X) representing the logic level complementary to the logic level X. We therefore have: C(X)=0 for X=1 and C(X)=1 for X=0. The nodes 16 and 17 contain the information in the form of a respective logic level Y and C(Y) with Y=X and C(Y)=C(X). The auto-stable assembly 1 makes it possible to store one and the same logic level at two different nodes respectively 14 and 16, 15 and 17.

For reasons of simplicity, it would be possible to design an auto-stable assembly comprising just four transistors. However, the reliability of operation of such an assembly would be degraded since such a memory-forming assembly is very sensitive to information loss due to the input of energy coming from outside such as, for example, the input of energy from a heavy ion passing through the semiconductor material at the level of the junction where one of the two logic levels is stored. The junction behaves like a capacitor that will be charged by the electron/hole pairs created upon the impact of the heavy ion. The variation in voltage across the terminals of the capacitor is determined by the ratio of the variation in charge to the value of the capacitor. This variation in voltage may then reach a level such that the logic level that is stored in the junction toggles, causing the toggling of the complementary logic level. The complementary logic levels confirming one another, it follows that the memory cell is in a stable state different from the initial state.

At present, the capacitors of the junctions reach very low values. As a result, the variation in voltage may easily reach the threshold of toggling of the information stored for small variations in charge. One would therefore prefer to use an auto-stable assembly 1 that exhibits information redundancy ensuring high security of operation.

The control assembly 2 comprises two breakers, here in the form of two PMOS transistors 18 and 19. The gates of the control transistors 18 and 19 are coupled to a control input of the circuit, denoted 20. The sources of the control transistors 18 and 19 are coupled to the supply voltage Vdd. The drain of the control transistor 18 is coupled to the node 14 whilst the drain of the control transistor 19 is coupled to the node 16 of the auto-stable assembly 1.

The blowable assembly 3 comprises a breaker 21, here an NMOS transistor, and a fuse 22 which is able to be blown, that is to say placed in open circuit, for example by means of a laser beam which causes it to melt. In an integrated circuit, the fuse 22 can take the form of a conducting strip of small width that can be reached by a laser beam on concluding the fabrication of the semiconductor circuit. The fuse 22 is coupled on one side to the node 14 of the auto-stable assembly 1 and on the other side to the drain of the transistor 21. The source of the transistor 21 is coupled to the ground of the circuit and its gate is coupled to the control input 20.

The logic gate 4 will, advantageously, be of NAND type with a first input coupled to the node 14, and it is recalled here that it is also coupled to the fuse 22, and a second input coupled to the control input 20. The output of the logic gate 4 is coupled to the output, denoted 23, of the circuit and to the control input of the breaker 5, in the present case to its gate, the breaker 5 being an NMOS transistor, whose drain is coupled to the node 16 and whose source is coupled to the ground of the circuit.

Figure 3:
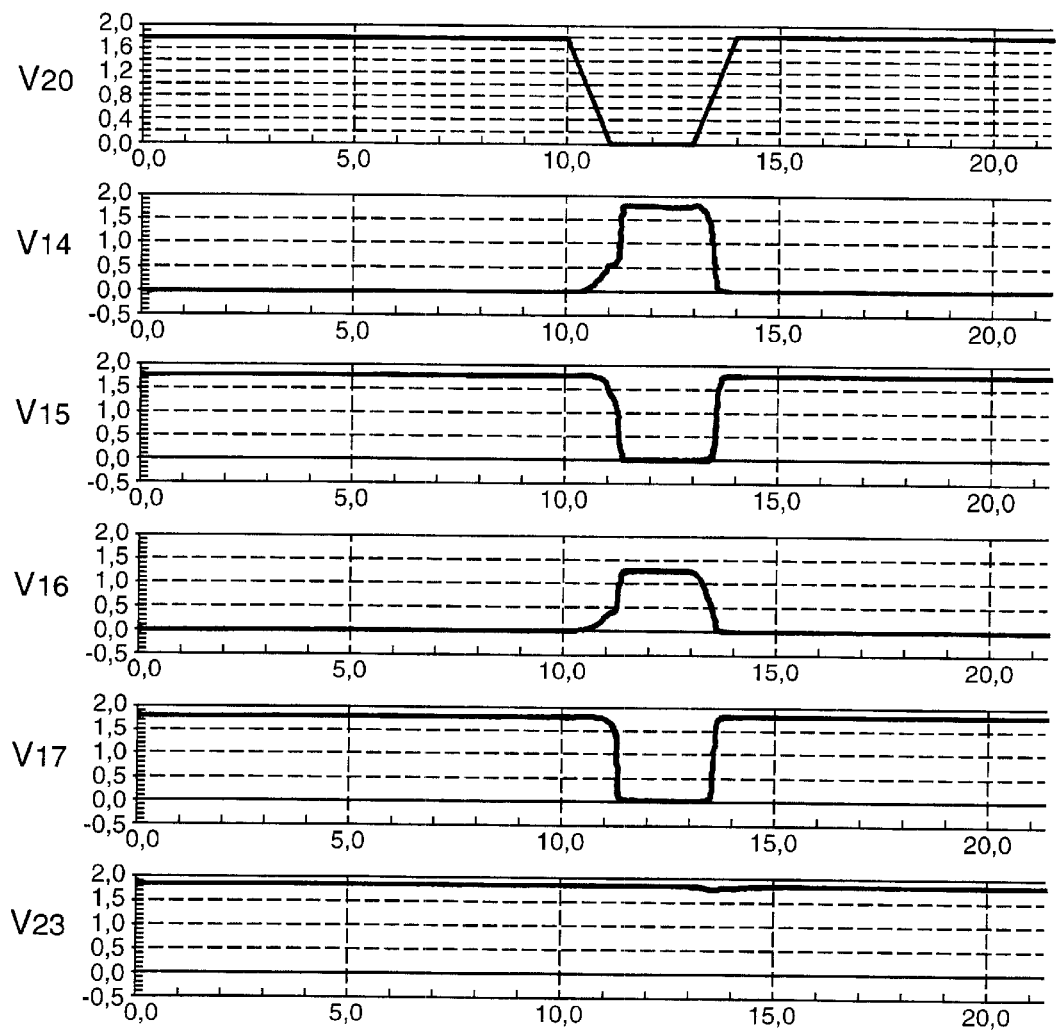
FIG. 3 is an operating chart, the blowable element being in the closed state.
Figure 4:
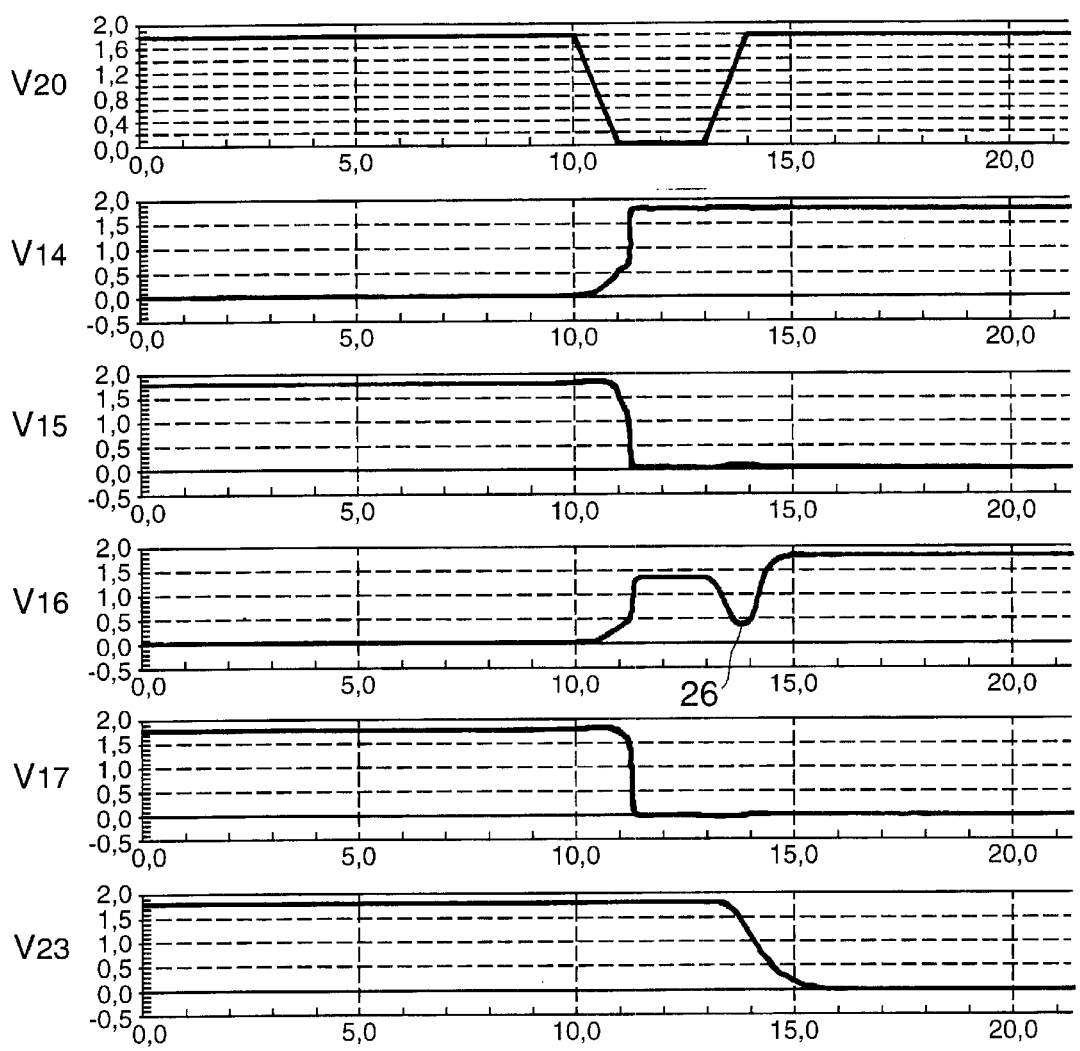
FIG. 4 is an operating chart, the blowable element being in the open state.

In FIGS. 3 and 4, the curves of voltages denoted Vx indicate the voltage at the node or point referenced x. The circuit operates as follows. Before blowing, the fuse 22 can be likened to a closed circuit. The drain of the transistor 21, the first input of the logic gate 4 and the node 14 are at the same potential.

When the input 20 is at a logic 1 level, the transistor 21 is on and hence the node 14 is at a 0 level. The control transistors 18 and 19 are off. The logic gate 4 sees a logic 0 level on its first input and 1 on its second input. Its output is at the 1 level. The transistor 5 is therefore on, the node 16 is therefore set to a 0 level and the nodes 15 and 17 take the complementary values, that is to say are at the 1 level.

The fuse 22 still being in the closed state, when the control input 20 switches to the 0 level, the transistor 21 is turned off while the control transistors 18 and 19 come on. The nodes 14 and 16 go to the logic 1 level whilst the nodes 15 and 17 take the complementary values, logic 0 level. The logic gate 4 sees a logic 1 level on its first input and 0 on its second input. Its output is therefore at the logic 1 level and the transistor 5 remains on. A conflict then occurs between the control transistor 19 and the transistor 5. Stated otherwise, the level of the node 16 tends to increase by reason of the on state of the control transistor 19 and to decrease by reason of the on state of the transistor 5. However, the control transistor 19 is dimensioned bigger than the transistor 5 that is of relatively small size. As a result, the node 16 takes the logic 1 level. The nodes 15 and 17 take the logic 0 level complementary to the logic 1 level of the nodes 14 and 16. It is therefore understood that, irrespective of the logic value of the input 20, the output 23 exhibits a constant logic value, in the present case 1. This manner of operation is illustrated in FIG. 3.

After blowing, the fuse 22 behaves like an open circuit. Stated otherwise, the first input of the logic gate 4 is coupled only to the node 14 and plus to the drain of the transistor 21. Immediately after the fuse 22 blows and as long as the control input 20 remains at the logic 1 level, the old state is maintained, namely the nodes 14 and 16 remain at the 0 level and the output 23 at the 1 level. Specifically, the node 14 now preserves its logic 0 level not because of the fuse 22 and of the breaker 21 in the on state, but simply by preserving the opposite logic value to the logic value of the node 17 which itself exhibits a logic value opposite to that of the node 16 which is set to the logic 0 value by the transistor 5 kept in the on state by the output of the logic gate 4.

When the input 20 switches to the logic 0 level, the control transistors 18 and 19 come on, thereby driving the nodes 14 and 16 to the logic 1 level, doing so, in respect of the node 16, despite the on state of the transistor 5 whose small dimensioning created, as was seen above, a priority to the logic level imposed by the control transistor 19 in the event of a conflict between these two transistors. The nodes 15 and 17 take the opposite logic values. The logic gate 4 therefore sees the logic 1 value of the node 14 on its first input and the logic 0 value of the input 20 on its second input and therefore preserves an output at the logic 1 value.

During the next switching of the control input 20, that is to say its return to the logic 1 level, the control transistors 18 and 19 turn off again. The transistor, still on, tends to drive the node 16 to a smaller value, to the logic 0 value as may be observed in FIG. 4. However, before the node 16 goes to the logic 0 value, the logic gate 4 sees on its first input the logic 1 value preserved by the node 14 and on its second input the logic 1 value originating from the control input 20. The logic gate 4 sends a logic 0 value on its output, thereby turning off the transistor 5. The node 16, which was tending to drop towards the logic 0 level, then rises back to the logic 1 level under the influence of the transistors 6 to 13 of the auto-stable assembly 1 which have not toggled. The output 23 of the circuit therefore goes to the 0 value and remains there irrespective of the subsequent change of the logic value of the control input 20. The fact that a downwards variation 26 of the voltage at the node 16 is observed in FIG. 4 when the control input goes from the 0 level to the 1 level is due to the slowness of operation of the logic gate 4.

Figure 2:
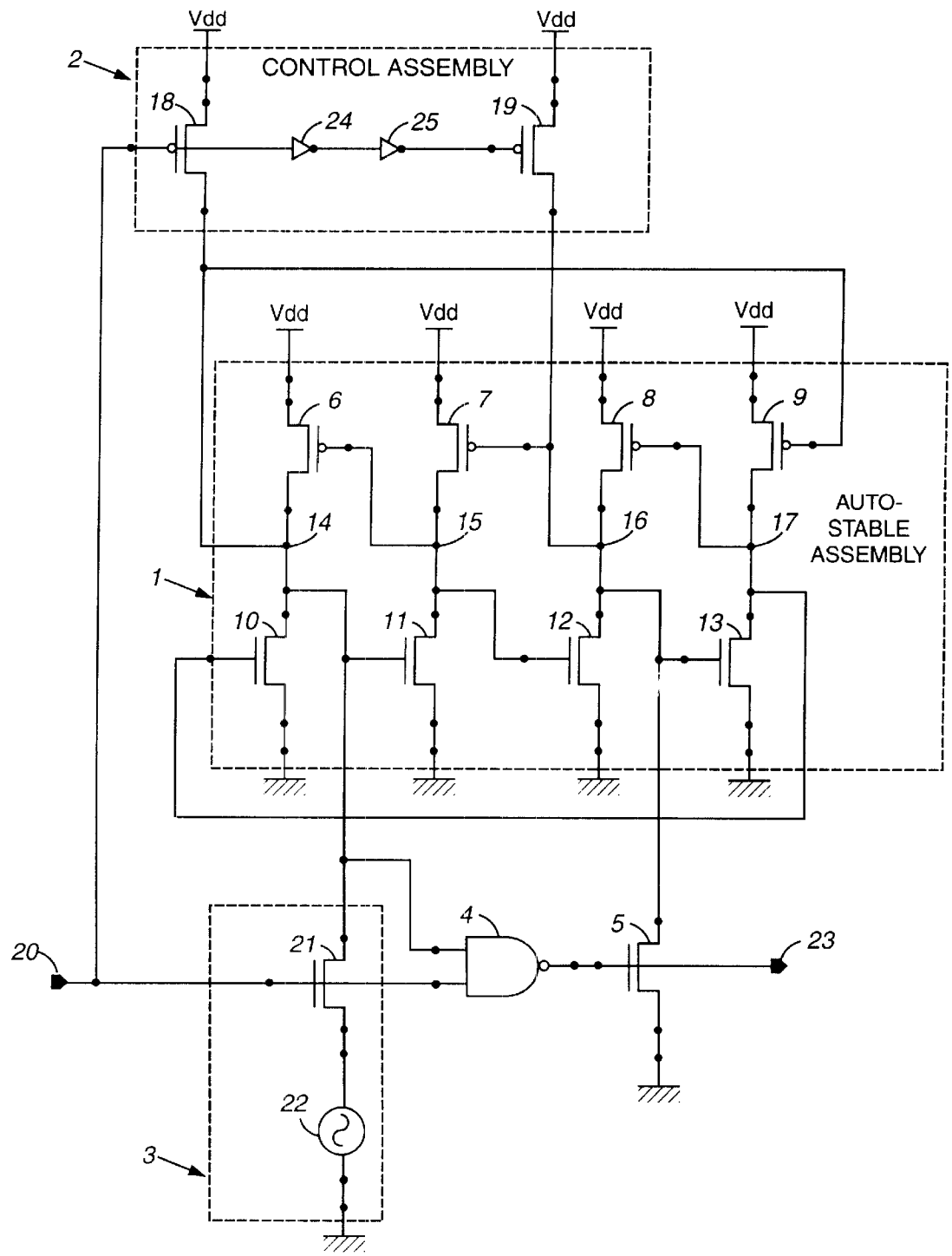
FIG. 2 is a variant of FIG. 1.

Illustrated in FIG. 2 is a variant similar to the above except for the fact that, in the blowable assembly 3, the breaker 21 and the fuse 22 are inverted, the fuse 22 being arranged between the ground and the source of the transistor 21. The drain of the transistor 21 is coupled to the node 14 and its gate is still coupled to the control input 20. The operation of the circuit as described hereinabove is not modified.

Moreover, two inverters 24 and 25 are arranged between the control input 20 and the gate of the control transistor 19. These two inverters 24 and 25 make it possible to slow down the switching of the transistor 19 and hence to reduce the conflicts between the control transistor 19 and the transistor 5, thereby making it possible to decrease the consumption of the circuit during switching. In particular, upon the first return to the logic 1 level of the control input 20 after the fuse 22 blows, these inverters 24 and 25 allow the transistor 19 to turn off slightly later and hence to maintain a higher voltage at the node 16, thereby augmenting the stability of operation of the auto-stable assembly 1 by allowing the logic gate 4 to switch earlier in relation to the turning-off of the control transistor 19 and consequently the transistor 5 to turn off likewise earlier in relation to the turning-off of the control transistor 19, resulting in a decrease in the reduction in the voltage at the node 16 which is noted in the corresponding curve of FIG. 4.

Finally, the invention makes it possible to produce in a relatively simple manner with a small number of transistors a circuit that serves as interface between a fuse and another circuit for which the logic information present on the output 23 relating to the state of the fuse 22 is destined. The fuse generally occupies a large area on a circuit because of the risks of impairing the neighboring elements during the laser firing intended to blow it. Now, the circuit described hereinabove, with reference to FIG. 2, can be produced on just one side of a rectangular surface on which the fuse is formed. Several fuses can therefore be arranged side by side, decreasing the area of safety per fuse, between fuses and integrated circuit proper insofar as there is no risk of a neighboring fuse being damaged by the blowing of another fuse. It is thus possible to optimize the use of the area of silicon. The use in the circuit of an auto-stable element with redundancy allows great safety of operation insofar as the arrival of a heavy ion or of an alpha ray on the junction of one of the transistors 6 to 13 of the auto-stable assembly will not jeopardize its operation and will not cause any modification of the output logic value. The circuit described hereinabove is all the more beneficial the smaller the width of etching, this causing a decrease in the elements other than the fuse and hence a relative increase in the area occupied by the fuse within the total area of the blowable circuit.

The invention applies in particular to codes for identifying microprocessors, to redundancies of volatile memories, to amplifiers, to secure definitive marking, in the field of bank cards or payment cards with reading prevention code.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An electronic circuit with digital output, comprising:
   an auto-stable assembly of latches;
   a control assembly;
   a blowable assembly;
   a logic gate comprising
      a first input coupled to a common point between the auto-stable assembly of latches and the blowable assembly, and
      a second input coupled to a control input of the electronic circuit; and
   a breaker controlled by the output of the logic gate and arranged between the auto-stable assembly and ground.

2. The electronic circuit according to claim 1, wherein the auto-stable assembly of latches comprises at least four breakers.

3. The electronic circuit according to claim 2, wherein the auto-stable assembly of latches comprises eight breakers.

4. The electronic circuit according to claim 1, wherein the control assembly comprises two control breakers.

5. The electronic circuit according to claim 4, wherein two inverters are arranged between the input of the electronic circuit and the control terminal of one of the control breakers.

6. The electronic circuit according to claim 4, wherein a control input of the electronic circuit is coupled to the control terminal of the two control breakers.

7. The electronic circuit according to claim 6, wherein two inverters are arranged between the input of the electronic circuit and the control terminal of one of the control breakers.

8. The electronic circuit according to claim 1, wherein the logic gate is of NAND type.

9. The electronic circuit according to claim 1, wherein the blowable assembly comprises a blowable element and a breaker which are arranged in series between the auto-stable assembly and ground.

10. The electronic circuit according to claim 9, wherein the auto-stable assembly of latches comprises at least four breakers.

11. The electronic circuit according to claim 10, wherein the auto-stable assembly of latches comprises eight breakers.

12. The electronic circuit according to claim 9, wherein the control assembly comprises two control breakers.

13. The electronic circuit according to claim 12, wherein two inverters are arranged between the input of the electronic circuit and the control terminal of one of the control breakers.

14. The electronic circuit according to claim 12, wherein a control input of the electronic circuit is coupled to the control terminal of the two control breakers.

15. The electronic circuit according to claim 14, wherein two inverters are arranged between the input of the electronic circuit and the control terminal of one of the control breakers.

16. The electronic circuit according to claim 14, wherein the logic gate is of NAND type.

17. The electronic circuit according to claim 14, wherein the blowable element is coupled to the auto-stable assembly.

18. The electronic circuit according to claim 17, wherein the logic gate is of NAND type.

19. The electronic circuit according to claim 17, wherein the breaker of the blowable assembly is coupled to the auto-stable assembly.

20. The electronic circuit according to claim 19, wherein the logic gate is of NAND type.

21. The electronic circuit according to claim 19, wherein the control assembly comprises two control breakers.

22. The electronic circuit according to claim 21, wherein two inverters are arranged between the input of the electronic circuit and the control terminal of one of the control breakers.

23. The electronic circuit according to claim 21, wherein a control input of the electronic circuit is coupled to the control terminal of the two control breakers.

24. The electronic circuit according to claim 23, wherein two inverters are arranged between the input of the electronic circuit and the control terminal of one of the control breakers.

25. The electronic circuit according to claim 21, wherein the auto-stable assembly comprises at least four breakers.

26. The electronic circuit according to claim 25, wherein the auto-stable assembly comprises eight breakers.

27. A process for reading a blowable element, comprising the steps of:

before blowing, a control input coupled to a first input of a logic gate being at a first logic value, breakers are off, imposing in a second input of the logic gate a logic value such that the output is at a complementary logic value;

before blowing, the control input being at the logic value complementary to the first logic value does not modify the output, the logic value of the second input of the logic gate being maintained, after blowing, the control input coupled to the first input of the logic gate being at a first logic value, the breakers coupled to the input of the circuit are off, imposing on the second input of the logic gate a logic value such that the output is maintained in the complementary logic value and that, after the control input has received a complementary logic value, the output goes permanently to the first logic value.

28. An integrated circuit comprising:

an auto-stable assembly of latches comprising at least four breakers;

a control assembly comprising two control breakers;

a blowable assembly comprising a blowable element and a breaker which are arranged in series between the auto-stable assembly and ground;

a NAND type logic gate comprising
a first input coupled to a common point between the auto-stable assembly of latches and the blowable assembly, and
a second input coupled to a control input in the integrated circuit; and a breaker controlled by the output of the NAND type logic gate and arranged between the auto-stable assembly and ground.

* * * * *